United States Patent [19]

Yamamoto et al.

[11] Patent Number: 4,739,265

[45] Date of Patent: Apr. 19, 1988

[54] NMR IMAGING METHOD

[75] Inventors: Etsuji Yamamoto, Akishima, Japan; Kensuke Sekihara, Mountain View, Calif.; Hidemi Shiono, Akigawa; Hideki Kohno, Tokyo, both of Japan

[73] Assignee: Hitachi, Ltd., Tokyo, Japan

[21] Appl. No.: 846,151

[22] Filed: Mar. 31, 1986

[30] Foreign Application Priority Data

Apr. 1, 1985 [JP] Japan ................................. 60-66470
Aug. 30, 1985 [JP] Japan ................................. 60-189652

[51] Int. Cl.$^4$ ................................................ G01R 33/20
[52] U.S. Cl. .................................... 324/309; 324/312; 324/308
[58] Field of Search ............... 324/300, 309, 308, 307, 324/311, 312; 128/653

[56] References Cited

U.S. PATENT DOCUMENTS 4,581,582  4/1986  Redington ........................... 324/308

FOREIGN PATENT DOCUMENTS 0109633  5/1984  European Pat. Off. ............. 324/309

Primary Examiner—Stewart J. Levy
Assistant Examiner—Louis M. Arana
Attorney, Agent, or Firm—Antonelli, Terry & Wands

[57] ABSTRACT

A method for providing spin density distribution images of an object, discriminated with respect to plural chemical shifts. This method is performed by repeating a measurement sequence in a spin warp imaging method, of the spin data plural times, with a time difference $\Delta\tau$ between a time interval $\tau_1$ from spin excitation to a 180° RF pulse and a time interval $\tau_2$ from the 180° RF pulse to a peak of a spin echo, altering $\Delta\tau$ in the ways corresponding the number of chemical shifts to be discriminated from one another, subjecting the respective spin data to two-dimensional Fourier transform to provide plural sets of spin data for respective coordinates in a spatial domain, and solving simultaneous equations of the sets of spin data to provide spin densities corresponding to the respective chemical shifts.

10 Claims, 4 Drawing Sheets

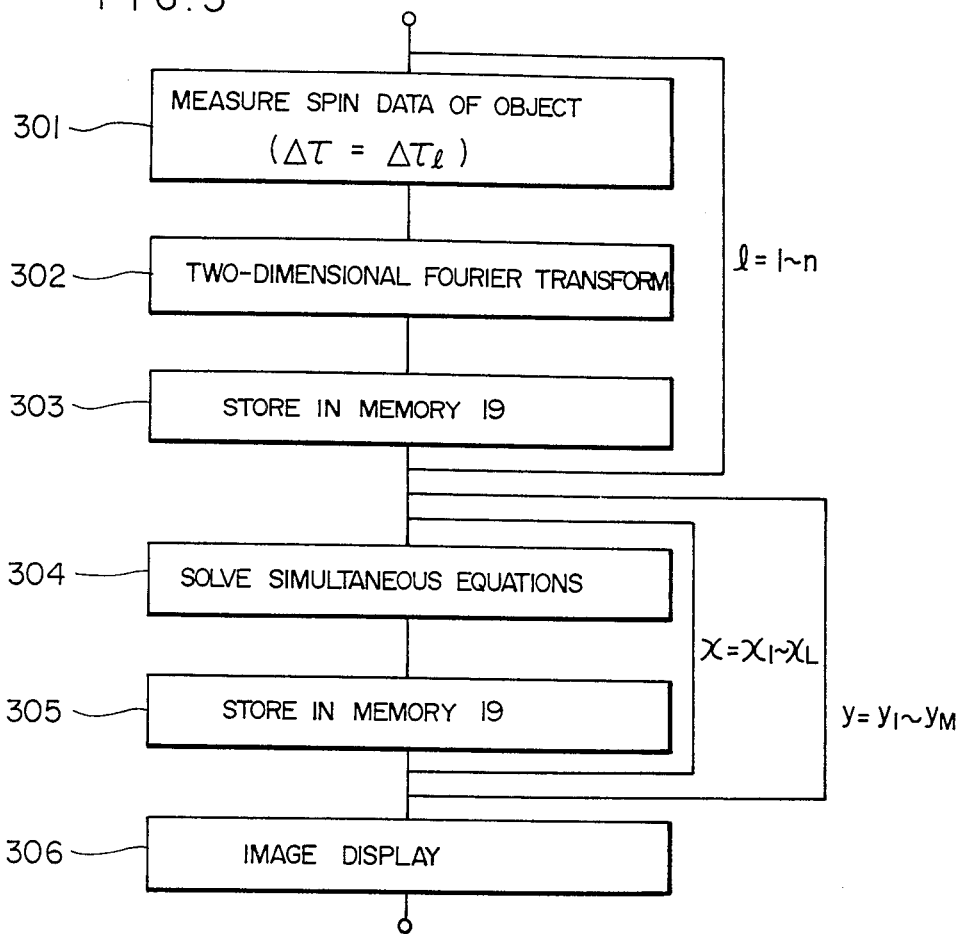
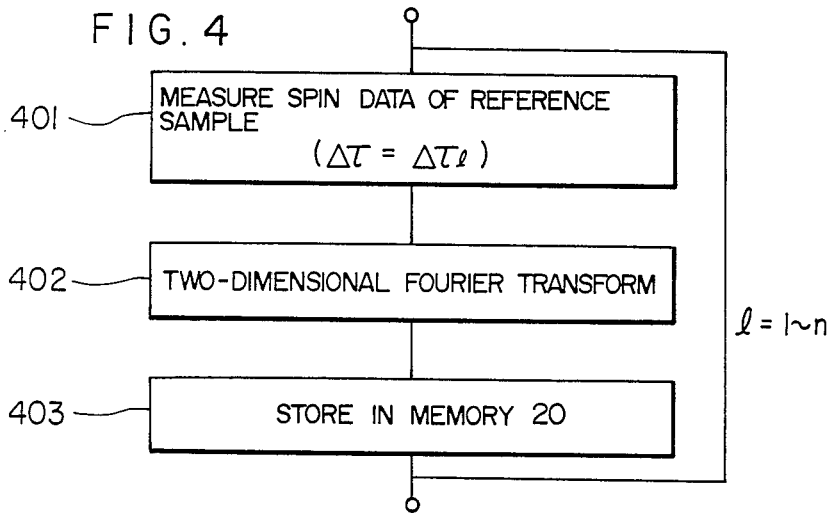

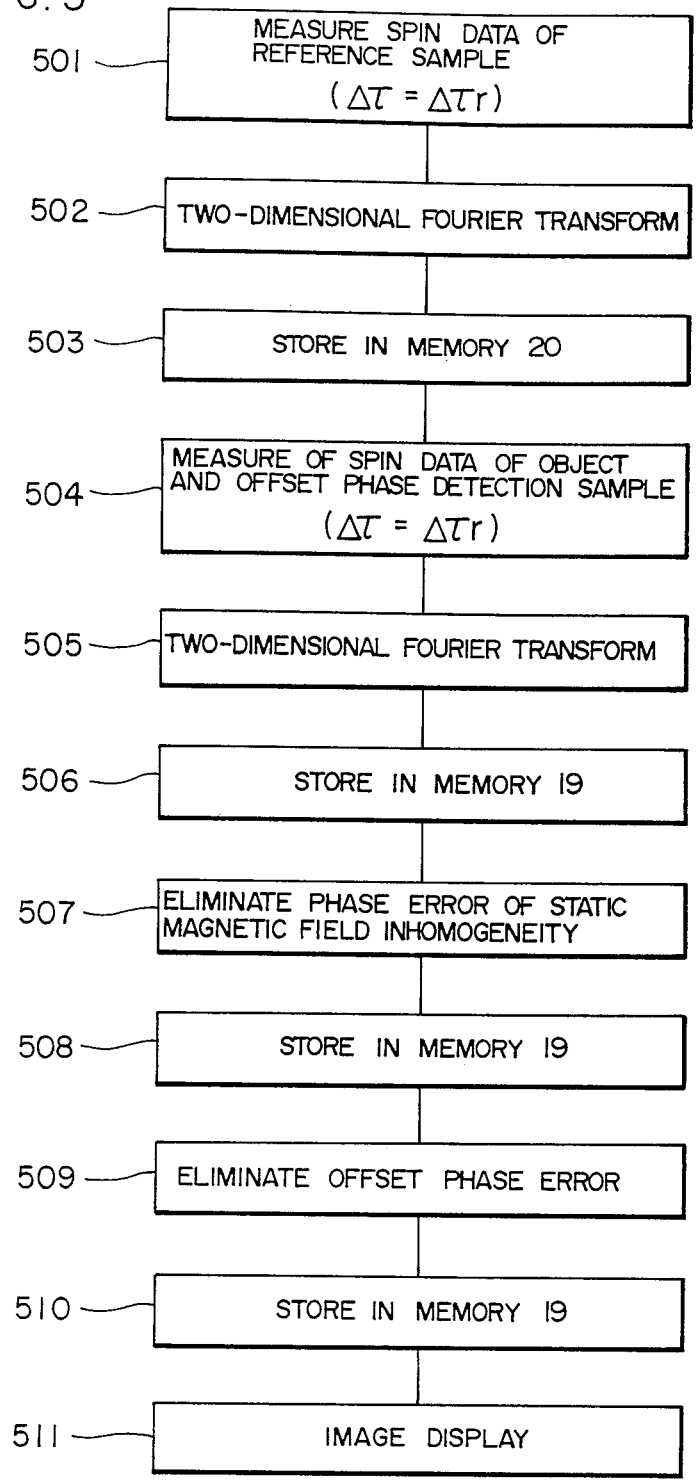

NMR IMAGING METHOD

BACKGROUND OF THE INVENTION

This invention relates to an imaging method using nuclear magnetic resonance and more particularly to a method which makes it possible to perform chemical shift imaging at a high speed.

In order to obtain an image of an object with the aid of NMR signals, it is necessary to separate and discriminate the NMR signals from the object according to respective positions of the object. One method for this purpose is to provide position information by applying a gradient magnetic field to the object to provide different static magnetic field intensities in accordance with the positions of the object so as to obtain different resonance frequencies or phase encode amounts at the positions.

The principal theory of this method has been reported in Journal of Magnetic Resonance, Vol. 18 page 69 (1975) and Physics of Medicine and Biology, Vol. 25, page 751 (1980).

One method of imaging an object using NMR signals is chemical shift imaging. The chemical shift is a phenomenon that spins provide their different resonance frequencies according to positions at a molecular structure since those spins even with the same nuclei are influenced by different magnetic fields according to their surrounding molecular structure. The chemical shift is a very important phenomenon since it gives information relative to the molecular structure of an object. Examples of imaging spin density images (hereinafter referred to as chemical shift images) discriminated from one another according to their chemical shift mainly consist of (a) an extension method of a Fourier imaging method reported by Maudsley et al in Journal of Magnetic Resonance, Vol. 51 page 147, 1983 and (b) a method proposed by Dixon in Radiology, Vol. 153, page 189, 1984.

The method of (a) makes it possible to separate and measure the chemical shifts by adding the frequency dimension to the spatial dimension. In this method, an image of an object is divided into L×M (L, M: integer) picture elements (pixels) in the case when it is a two dimensional plane, and N (N: integer) signal points are sampled for each pixel. The value of L or M is determined according to the space resolution used. For example, if L=M=128, L×M=16,384. Although N signal points can be sampled by one measurement, the time close to a longitudinal relaxation time of an object (about 1 sec in the case of a human body) must elapse before a subsequent measurement. Thus, the measurement time of 4.6 hours is required for L×M measurements.

On the other hand, the method of (b) constitutes an image containing only the information relative to a specific chemical shift from the sum of and the difference between two images in the cases of intervals $\tau_1 = \tau_2$ and intervals $\tau_1 \neq \tau_2$ in a pulse sequence of 90°—$\tau_1$—180°—$\tau_2$—(signal measurement), 90° and 180° represent RF pulses flipping the spin by 90° and 180°, respectively. This method is very practical since the time required for the signal measurement is only twice as long as the time required to construct one image. However, the phase change of the spin due to the chemical shift is almost the same as or smaller than the phase change due to the inhomogeneity of the static magnetic field, and both changes cannot be discriminated from each other. Dixon et al proposed to remove the influence due to the static magnetic field inhomogeneity by calculating a square root of the sum of the squares of a real part and an imaginary part after the complex Fourier transform, i.e. absolute value. Nevertheless, both chemical shifts cannot be discriminated depending on the spin numbers corresponding to two chemical shifts. Further, in the method of (b), the chemical shifts to be detected are limited to two kinds. Also, in order to obtain two chemical shift images, the measurement must be carried out under two different conditions.

SUMMARY OF THE INVENTION

An object of this invention is to provide an imaging method which makes it possible to obtain, in a short time, nuclear spin density distribution images (chemical shift images) discriminated from one another, relative to plural kinds of chemical shift of an object.

Another object of this invention is to provide a chemical shift imaging method which is capable of reducing the measurement time of an object.

Still another object of this invention is to provide an NMR imaging method which is capable of obtaining correct chemical shift images by effectively removing phase errors of spin data due to non-uniform distribution of a static magnetic field, i.e., static magnetic field inhomogeneity and by removing an offset phase error induced regardless of the spin position.

A gist of this invention resides in that operations among plural images are performed without taking the absolute value of the results after Fourier transforms to obtain correct chemical shift images with the aid of a Fourier imaging method that has been also used in the method by Dixon.

More specifically, in accordance with this invention, there is provided a method for obtaining spin data at each of coordinates of a spatial domain through two-dimensional transforms by repeating a measurement sequence of nuclear spin excitation—nuclear spin inversion by a 180° RF pulse—measurement of a resonance signal, altering phase encode amounts, characterized in that a difference $\Delta T$ is provided between the time interval from said excitation to said inversion and the time interval from the inversion to the peak of the resonance signal, this difference $\Delta t$ is varied in plural values to effect plural measurements and two-dimensional Fourier transforms, and the plural image data thus obtained are employed to solve simultaneous equations including spin densities relative to chemical shifts as unknown values to obtain chemical shift images.

The maximum number of equations in the simultaneous equations corresponds to that of chemical shifts to be discriminated from one another. Therefore, n kinds of chemical shift image can be obtained by repeating the measurement with $\Delta \tau$ varied in n manners when either one of the real part and the imaginary part of the nuclear spin data obtained through the Fourier transforms is used. They can be also obtained by repeating the measurement with $\Delta \tau$ varied in n/2 manners when both real parts and imaginary parts are used. In the latter method, two kinds of chemical shift can be obtained using only one $\Delta \tau$ so that they can be obtained in the same measurement time as in normal imaging in which chemical shifts are not discriminated.

In the measurement sequence in the case of $\tau_1 \neq \tau_2$, the spin data obtained may contain phase errors due to inhomogeneity of the static magnetic field. To obviate this difficulty, in accordance with this invention, a reference sample including only the nuclear spin of a single chemical shift is measured in the same sequence as the above measurement sequence and the spin data obtained by the two-dimensional Fourier transform are employed as terms of phase rotation due to the static magnetic field errors in the simultaneous equations. Thus, the phase rotation due to only the chemical shifts can be calculated, permitting correct chemical shift imaging. In particular, in the case of two kinds of chemical shift, if $\Delta \tau$ of the measurement sequence is set so as to produce the phase errors that are odd number times of $\pi/2$ in the nuclear spin data between the two kinds of chemical shift, the phase errors due to the static magnetic field inhomogeneity can be cancelled only by taking the product of the complex data obtained from the imaging of the object and the complex conjugates of the complex data obtained from the imaging the reference sample having one chemical shift and the real part and imaginary part of the product represent density images of the chemical shifts, respectively. Thus, this greatly facilitates the calculation of solving the simultaneous equations.

BRIEF DESCRIPTION OF THE DRAWINGS

FIGS. 3 to 5 are flowcharts of operations of embodiments according to this invention.

DESCRIPTION OF PREFERRED EMBODIMENTS

Prior to the explanation of the embodiments of this invention, a modified spin warp method adopted in the embodiments will be simply explained.

Figure 1:
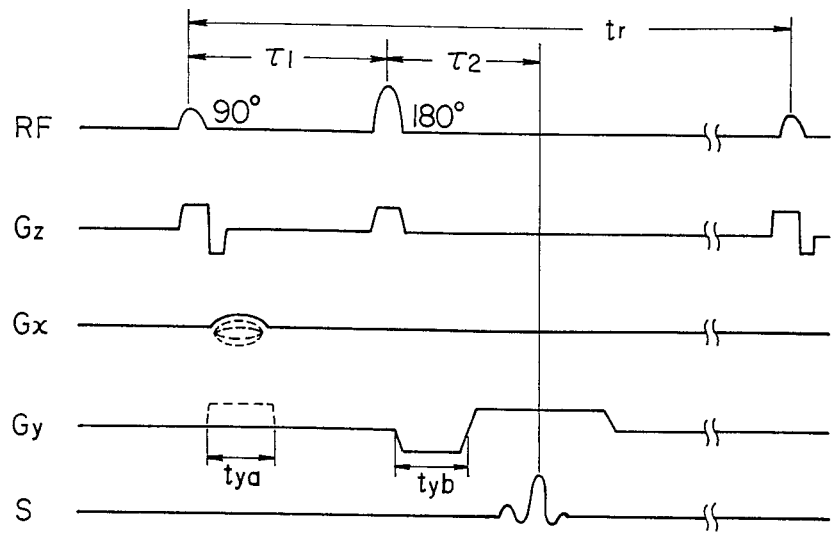
FIG. 1 is a time chart of a measurement sequence employed in embodiments of this invention.

FIG. 1 shows timings of RF pulses for effecting a two-dimensional modified spin warp method, gradient magnetic fields in the x and y directions and signals from nuclear spins. Now, it is assumed that a certain slice parallel to the (x,y) plane is selected. In this figure, RF represents the RF pulses, and S represents a signal from the nuclear spin. $G_z$ represents a gradient magnetic field supplying the field gradient in the z-direction to the static magnetic field so as to select said slice; $G_x$ represents an x-direction gradient magnetic field of a selectable amplitude for phase encode; and $G_y$ represents a y-direction gradient magnetic field for reading out resonance signals.

First, a 90° RF pulse is applied in the presence of Gz to flip the nuclear spins in a slice by 90° and excite them. Next, a 180° RF pulse is applied when its center is placed at the point when the time interval $\tau_1$ has elapsed from the center of the 90° RF pulse. The signal observation is carried out in the presence of Gy. Incidentally, in the ordinary imaging, a setting of $\tau_1=\tau_2$ is adopted assuming that $\tau_2$ is a time interval elapsing from the center of the 180° RF pulse to the peak of a spin echo.

The two-dimensional signal $S(G_x,t_y)$ obtained from such an observation carried out altering the amplitude of x direction gradient magnetic field has the following relation with the nuclear spin density or distribution $\rho(x,y)$ on the selected slice:

$$S(G_x,t_y)=\rho(x,y) \exp \{-j\gamma(G_x xt_x+G_y yt_y)\} \exp (j\theta_0)dxdx \quad (1)$$

It should be noted that in this equation the absence of inhomogeneity of the static magnetic field is supposed and any chemical shift is absent. $\theta_0$ represents a phase offset independent of the spin positions, determined by the positions of an object located during the observation, etc.

Now, in accordance with this invention, the signal measurement is performed with $\tau_1$ and $\tau_2$ set at different values, $\tau_1=\Delta\tau+\tau_2$ in the measurement sequence as shown in FIG. 1. To this end, a period $T_{yb}$ during which $G_y$ is applied with the polarity opposite to that at that time of read-out is adjusted. The same effect can also be obtained, instead of the application of $G_y$ during the period $T_{yb}$, by applying $G_y$ in the same polarity as that at the time of read-out during the period $T_{ya}$ and adjusting this period. Also, this can be obtained by adjusting the period during which any pulse is not applied, with $T_{ya}$ or $T_{yb}$ fixed.

Assuming in the measurement sequence according to this invention that the chemical shift of the nuclear spins in the object is $\sigma$, the spin density of the nuclear spin is $\rho(x,y)$ and the inhomogeneity of the static magnetic field is $E(x,y)$, the measurement signal is expressed as $$\overline{S}(G_x,t_y)=\int\int\rho(x,y) \exp \{-j\gamma[G_x xt_x+G_y yt_y+(E(x,y)+\sigma)](\Delta\tau+t_y)]\} \exp (j\theta_1)dxdy \quad (2)$$

where $\theta_1$ represents a phase rotation dependent on the measurement condition but independent of the position.

Transforming Equation (2) gives $$S(G_x,t_y)=\int\int\rho'(x,y) \exp \{-j\gamma[G_x xt_x+(G_y y+E(x,y)+\sigma)t_y]\} \exp (j\theta_1)dxdy \quad (3)$$

where $$\rho'(x,y)=\rho(x,y) \exp \{-j\gamma(E(x,y)+\sigma)\Delta\tau\} \quad (4)$$

Although in Equation (2) the chemical shift has been set at $\sigma$, there are actually plural kinds of chemical shift in the object. Thus, if the spin density corresponding to the k-th chemical shift $\sigma_k$ is $\rho_k(x,y)$. Equations (3) and (4) are written as $$S(G_x, t_y) = \sum_k \int\int \rho k'(x, y) \exp \{-j\gamma[G_x xt_x + (G_y y + E(x, y) + \sigma_k)) t_y]\} \exp(j\theta_1)dxdy \quad (5)$$

where $$\rho'_k(x,y)=\rho_k(x,y) \exp \{-j\gamma(E(x,yL)+\sigma_k)\Delta\tau\} \quad (6)$$

When the integration variables are $$\left.\begin{array}{l} x' = x \\ y'_k = y + \dfrac{E(x, y)}{G_y} + \dfrac{\sigma_k}{G_y} \end{array}\right\} \quad (7)$$

The signal is written as $$S(G_x, t_y) = \sum_k \int\int \rho''_k(x', y_k') \exp \{-j\gamma(G_x x' t_x + G_y y'_k t_y)\} \exp(j\theta_1)dx'dy_k' \quad (8)$$

where the relation between $\rho''_k(x',y'_k)$ and $\rho'_k(x,y)$ is expressed as $$\rho''_k(x',y'_k) = \rho'_k(x,y'_k)/J_k(x,y) \quad (9)$$

where $J_k(x,y)$ is a Jacobian used in the integral transformation.

If $E(x,y)$ gives a small change with respect to y and $y'_k$ is nearly equal to y, the following equation holds $$\rho''_k(x',y'_k) = \rho'_k(x,y) \quad (10)$$

Thus, effecting the inverse Fourier transform of Equation (8) gives $$\begin{aligned} F^{-1} S(G_x, t_y) &= \sum_k \rho''_k(x', y'_k) \exp(j\theta_1) \\ &\simeq \sum_k \rho'_k(x, y) \exp(j\theta_1) \\ &= \sum_k \rho_k(x, y) \exp\{-j\gamma(E(x, y) + \sigma_k)\Delta\tau\} \exp(j\theta_1) \end{aligned} \quad (11)$$

where $(x,y_k)$ is a value obtained when solving Equation (7) with respect to x and y.

From Equation (11), the real part $R_e$ of $F^{-1}\{S(G_x,t_y)\}$ is written as $$R_e(\Delta\tau) = \sum_k \rho_k(x,y) [\cos\{\gamma(E(x,y) + \sigma_k)\Delta\tau\} \cos\theta_1 + \sin\{\gamma(E(x,y) + \sigma_k)\Delta\tau\} \sin\theta_1] \quad (12)$$

Now, if $\Delta\tau$ is changed in n values, the real part Re for l-th $\Delta\tau$ is written as $$R_e(\Delta\tau_l) = \sum_k \rho_k(x,y) [\cos\{\gamma(E(x,y) + \sigma_k)\Delta\tau_l\} \cos\theta_l + \sin\{\gamma(E(x,y) + \sigma_k)\Delta\tau_l\} \sin\theta_l] \quad (13)$$

where $\theta_l$ represents a phase offset independent of the spin positions but varies on each measurement.

Then, if the static magnetic field inhomogeneity $E(x,y)$ and the offset phase $\theta_l$ are known, the measurement is carried out with different $\Delta\tau$'s in order to obtain n $R_e(\Delta\tau_l)$'s. And by solving the simultaneous Equations (13), all the nuclear spin densities corresponding to the n kinds of chemical shift can be obtained.

Since the offset phase $\theta_l$ is made negligible by the instrument adjustment, one embodiment of the invention for providing $\rho_k$'s ignoring this offset will be explained below.

Figure 2:
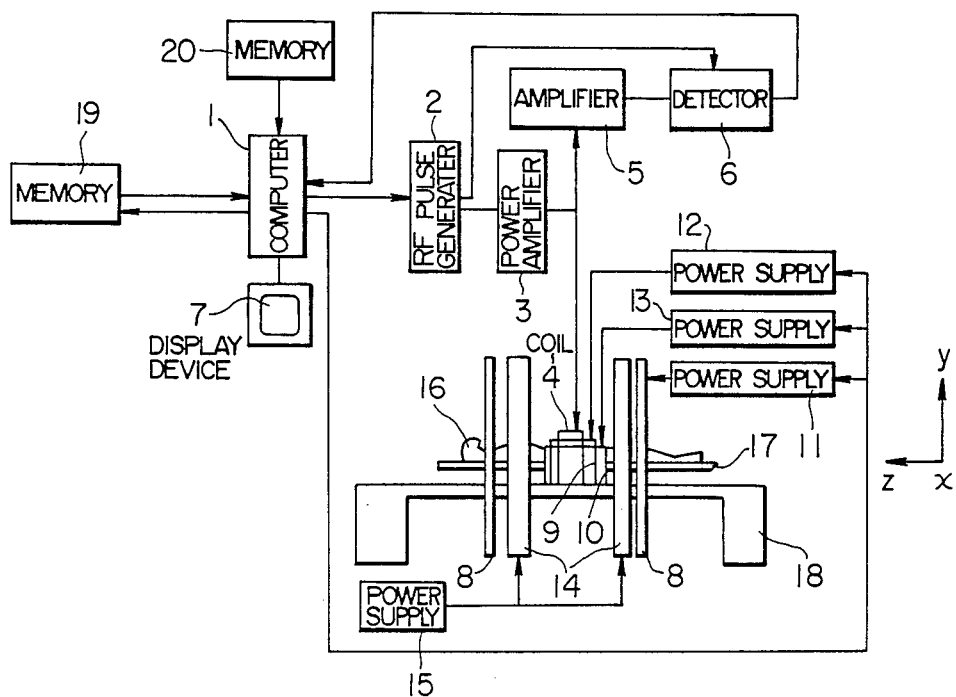
FIG. 2 is a block diagram of an apparatus for performing the method according to this invention.
Figure 6:
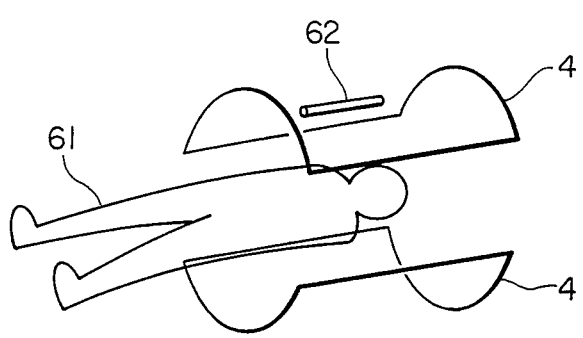
FIG. 6 is a rough sketch showing the measurement status in the apparatus shown in FIG. 2.

FIG. 2 is a block diagram of an imaging apparatus used for performing one embodiment of this invention. In this figure, 1 is a computer, 2 is an RF pulse generator, 3 is a power amplifier, 4 is a coil for generating an RF magnetic field as well as detecting signals sent from an object 16, 5 is an amplifier, 6 is a detector, and 7 is a display device. 8, 9 and 10 are gradient coils for producing field gradients in the z, x and y directions, respectively. 11, 12 and 13 are power supplies for driving coils 8, 9 and 10, respectively.

Computer 1 serves to supply different instructions to the respective devices with certain timings. The output from RF pulse generator 2 is amplified by power amplifier 3, and excites coil 4. Coil 4, as mentioned above, also serves as a receiving coil so that the received signal is detected by detector 6 via amplifier 5 and thereafter the detected signal is sent to computer 1. The signal subjected to signal processing in computer 1 is converted into an image by display device 7.

The static magnetic field is generated by a coil 14 driven by a power supply 15. Object 16 (the human body) is placed on a bed 17, and this bed 17 is adapted to be shiftable on a support 18, 19 and 20 are storage devices or memories.

One embodiment of this invention will be explained with reference to the flowchart of FIG. 3.

First, in Step 301, nuclear spin data in a selected slice of a object are provided by repeating the measurement sequence as shown in FIG. 1. The difference between $\tau_1$ and $\tau_2$ in this measurement sequence is set at $\Delta\tau_l$. In Step 302, the spin data in a time domain, obtained by said measurement are subjected to a two-dimensional Fourier transform in computer 1 to provide spin data at individual coordinates, expressed in Equation (8). In Step 303, the real part $R_e(\Delta\tau_l)$ of the spin data thus obtained is stored in memory 19. The above measurement is repeated $l = 1 - n$ times which means the number of chemical shifts to be discriminated from are another. In this repetition, the difference between $\tau_1$ and $\tau_2$, i.e., $\Delta\tau_l(l=1-n)$ is changed in order so as to provide simultaneous linear equations of Equations (13) independent of one another.

In Step 304, the simultaneous equations of Equations (13) are solved for each coordinate using the n data stored in memory 19 by the repetition of Steps 301–303. More specifically, the chemical shifts $\sigma_k$'s ($k = 1 - n$) and the data indicative of the static magnetic field inhomogeneity, $E(x,y_k)$ are loaded in computer 1 from memory 20 to sequentially the values of $\cos\{\gamma E(x,y) + \sigma_k)\Delta\tau_l\}$ for $k = 1 - n$. $R_e(\Delta\tau_l)$'s are sequentially loaded in computer 1 for $l = 1 - n$. Thus, by solving the n simultaneous equations of Equations (13), $\rho_k(x,y)$ is obtained.

In Step 305, this value is stored in another area. This processing is repeated for all the pixels, i.e., for $x = x_1 - x_L$ and $y = y_1 - y_L$ so that spin density distribution images discriminated from one another with respect to the chemical shifts $\sigma_k(k = 1 - n)$ are stored in memory 19. In Step 306, any image selected from the stored images is displayed on display device 7.

Next, explanation will be given of a method for providing the data indicative of the static magnetic field inhomogeneity, $E(x,y)$, which have been previously stored in memory 20 in the case of the above embodiment. FIG. 4 is a flowchart for performing this method.

First, a vessel filled with a reference sample having one kind of chemical shift is placed in coil 4. The measurement is carried out in entirely the same sequence as in the case of observing the object, i.e., with n differences between $\tau_1$ and $\tau_2$, $\Delta\tau_l$'s altered (Step 401). The results thus obtained are subjected to two-dimensional Fourier transform (Step 402). The thus obtained spin data on the coordinates in the spatial domain is expressed as $$F^{-1}\{S_c(G_x,t_y)\} = P_c(x,y) \exp\{-j\gamma E(x,y)\tau_l\} \exp(j\theta_c) \quad (14)$$

Now, since the spin density $\rho_c(x,y)$ of the reference sample is fixed and the offset phase can be made zero, the values of the phase error due to $E(x,y)$ can be obtained. These values are stored in memory 20 (Step 403).

Although in the above embodiments, only the real part of the result of Fourier transform (Equation (11)), the imaginary part can also be employed. Both real part and imaginary part may be used. In this case, $\Delta\tau_l$ must be selected so that the real part and the imaginary part provide linear equations independent of one another, but $\Delta\tau_l$ may be changed in only n/2 ways. More specifically, since the total n equations can be obtained from the real part and the imaginary parts by the n/2 times repetition of the measurement of the object, solving them gives n kinds of chemical shift.

When only two kinds of chemical shift exist for the spins in the object, the chemical shift images discriminated from each other can be obtained through particularly simple arithmetic. An embodiment in this case will be explained with reference to a flowchart of FIG. 5.

First, in Step 501, the vessel filled with the reference sample with $\sigma_k=0$, i.e., one kind of chemical shift is placed in coil 4. And the measurement of NMR signals is carried out through the repetition of the sequence as shown in FIG. 1. In this case, when the chemical shifts in the object are $\sigma_1$ and $\sigma_2$, the difference $\Delta\tau$ between $\tau_1$ and $\tau_2$ is set so as to satisfy $$\gamma(\sigma_2-\sigma_1)\Delta\tau_r=\pi/2 \tag{15}$$

In Step 502, the data in a time domain, obtained by said measurement are subjected to two-dimensional Fourier transform in computer 1 to provide data at the respective coordinates in a spatial domain.

The spin data thus obtained is expressed as Equation (14). Assuming that the real part and imaginary part in a complex number of Equation (14) are $E_r(x,y)$ and $E_i(x,y)$, the following relation is obtained.

$$[\exp\{-j\gamma E(x,y)\Delta\tau_l\}\exp(j\theta_c)]^* = \frac{E_r(x,y) - jE_i(x,y)}{|E_r(x,y) + jE_i(x,y)|} \tag{16}$$

where [ ]* represents a complex conjugate.

In Step 503, a phase image for correction is extracted from the real part $E_r(x,y)$ and the imaginary part $E_i(x,y)$ through Equation (16) and is stored in memory 20.

In Step 504, the object is placed in coil 4 as shown in FIG. 2, the measurement of NMR signals sent from the object is carried out in the same measurement sequence as in Step 501, i.e., with the difference $\Delta\tau_r$ between $\tau_1$ and $\tau_2$ satisfying Equation (15). In this embodiment, the offset phase error mixed into the spin data obtained is also cancelled by arithmetic. For this purpose, in Step 504, a sample 62 for detection of an offset phase is placed at a predetermined position in coil 4, and the measurement of the spin data for both object 61 and sample 62. The sample 62 used is a material having one of chemical shifts $\sigma_1$ and $\sigma_2$, e.g. $\sigma_1$, inserted in a test tube. It should be noted that in the spin data measurement for both object and offset phase detection sample, the repetition period $T_r$ in the measurement sequence as shown in FIG. 1 must be set so as to be far longer than the relaxation time of the object.

In step 505, the spin data obtained in Step 504 are subjected to two-dimensional Fourier transform to provide the data on the respective coordinates in a spatial domain. This Fourier transform is expressed as $$F^{-1}\left\{S(G_x, t_y) = \sum_{k=1}^{2} \rho_k(x, y) \exp\{-j\gamma(E(x, y) + \sigma_k)\Delta\tau\}\exp(j\theta_1)\right. \tag{17}$$

In Step 506, the data thus obtained are stored in memory 19.

It is of course that either one of Steps 501 to 503 and Steps 504 to 506 can be preceded by the other.

In Step 507, the phase error of the image corresponding to the object is eliminated. More specifically, computer 1 loads the correction phase image (Equation (16)) from memory 20 and $F^{-1}\{S(G_x,t_y)\}$ from memory 19 to take a product of both, i.e., image data.

The product P(x,y) is stored in memory 19 in Step 508. This P(x,y) is expressed through the product of Equations (16) and (17) as $$P(x,y)=\{\rho_1(x,y)+\rho_2(x,y)\exp(-j\cdot\pi/2)\}\cdot\exp(-j\gamma\sigma_1\Delta\tau)\cdot\exp\{-j(\theta_1-\theta_c)\} \tag{18}$$

Thus, if the offset phase can be set so that the phase term $\exp(-j\gamma\sigma_1\Delta t)\cdot\exp\{-j(\theta_1-\theta_c)\}$ in Equation (18) is fixed, the chemical shift images $\rho_1(x, y)$ and $\rho_2(x, y)$ can be obtained. Further, if the static magnetic inhomogeneity is smaller than the chemical shift, the above Steps 501-503 and 507 may be omitted.

In this embodiment, the above phase term is eliminated using the measured offset phase data. Namely, in Step 509, the data at a center position of the offset phase detection sample, of the image data P (x,y) stored in memory 19 is loaded in computer 1. Assuming that this data is $Q_r+jQ_i$, the following equation holds.

$$\exp(-j\gamma\sigma_1\Delta\tau_l)\exp\{-j(\theta_1-\theta_c)\} = \frac{Q_r + jQ_i}{|Q_r + jQ_i|} \tag{19}$$

Inserting the complex conjugates of Equation (19) obtained from $Q_r$ and $Q_i$ into Equation (18) gives a correction data T(x,y) as expressed as $$T(x,y)=\rho_1(x,y)-j\rho_2(x,y) \tag{20}$$

The real part $\rho_1(x,y)$ in Equation (20) represents a spin density image of the chemical shift $\sigma_1$ and the imaginary part $\rho_2(x,y)$ represents a spin density image of the chemical shift $\rho_2$. Thus, in Step 510, the real part and the imaginary part of T(x,y) are stored in memory 19.

In Step 511, the spin density images thus obtained are displayed on display device 7. More specifically, the display of the real part $\rho_1(x,y)$ in Equation (20) provides a spin density distribution image corresponding to the chemical shift $\rho_1$ while the display of the imaginary part $\rho_2(x,y)$ provides a spin density distribution image corresponding to the chemical shift $\rho_2$. Further, calculating $\rho_1(x,y)+\rho_2(x,y)$ or $\{\rho_1^2(x,y)+\rho_2^2(x,y)\}$ and displaying it gives spin density images not discriminated depending on the chemical shifts.

In those embodiments mentioned above, the measurement sequence employs spin inversion by the 180° pulses, but the measurement sequence not including the 180° pulses, i.e., the sequence of an original spin warp imaging may also be adopted in this invention. In this case, the time difference $\Delta\tau$ between $\tau_1$ and $\tau_2$ in the above embodiments corresponds to the time difference from the spin excitation (application of a 90° RF pulse) to the peak of the spin echo, so that n kinds of chemical shift image can be obtained, e.g., by the repetition of the measurement with the time difference altered in n ways.

We claim:

1. An NMR imaging method comprising the steps of:

(a) placing an object within a predetermined static magnetic field, the object having nuclear spins with plural kinds of chemical shift;

(b) obtaining nuclear spin data of the object in a time domain including sub-steps of,
  (1) exciting nuclear spins in a predetermined slice of the object,
  (2) inverting the sense of the nuclear spins by applying a 180° RF pulse in order to generate a spin echo,
  (3) applying a first field gradient of selectable amplitude along a first direction to encode spatial information into the phase of the nuclear spins,
  (4) applying a second field gradient along a second direction perpendicular to the first direction to generate a peak in a resonance signal so that a time $\tau_1$ from the excitation of the nuclear spins to the inversion of the sense of the nuclear spins is made different by a time difference $\Delta\tau$ from a time interval $\tau_2$ from the inversion of the sense of the nuclear spins to the peak of the resonance signal,
  (5) reading out the resonance signal in the presence of the second field gradient, and
  (6) repeating a measurement sequence of the sub-steps (1)–(5) with the amplitude of the first field gradient being altered in the successive repetition;

(c) transforming the nuclear spin data in the time domain into nuclear spin data at respective coordinates in a spatial domain through two-dimensional Fourier transform;

(d) repeating the steps (b) and (c) with the time difference $\Delta\tau$ being altered in the successive repetition; and (e) solving simultaneous equations of the data of the respective coordinates of the spatial domain, obtained by the repetition to obtain the nuclear spin distribution in the slice of the object, each distribution corresponding to each chemical shift.

2. An NMR imaging method according to claim 1, further comprising the step of measuring error distribution of the static magnetic field in the slice of the object, wherein the simultaneous equations each includes a term of a phase error of spin data due to the static magnetic field error distribution, the term of the phase error being eliminated by the value of the error distribution.

3. An NMR imaging method according to claim 2, wherein the step of measuring the static magnetic field error distribution comprises the steps of:
  obtaining nuclear spin data of a reference sample having a single chemical shift in the time domain by repetition of a measurement sequence corresponding to the measurement sequence of sub-steps (1)–(5); and
  transforming the nuclear spin data of the reference sample into nuclear spin data at respective coordinates in a spatial domain for two-dimensional Fourier transform.

4. An NMR imaging method according to claim 1, further comprising the step of eliminating an offset phase error induced regardless of positions of the nuclear spin data in the spatial domain.

5. An NMR imaging method according to claim 4, wherein the offset error is detected by simultaneously measuring, in the measurement sequence, the nuclear spin data of the object as well as that of a reference sample having a single chemical shift and placed in the static magnetic field together with the object.

6. An NMR imaging method according to claim 1, wherein the steps (b) and (c) are repeated by at least a number of times corresponding to the number of the nuclear spin chemical shifts included in the object, and the time difference $\Delta\tau$ in the measurement sequence is altered for each successive repetition so as to provide linear equations independent of one another.

7. An NMR imaging method according to claim 1, wherein the steps (b) and (c) are repeated by at least a number of times corresponding to one-half the number of the nuclear spin chemical shifts included in the object and the respective real parts and imaginary parts of the spin data at the respective coordinates in a spatial domain proive simultaneous linear equations independent of one another and corresponding to at least the number of the chemical shifts.

8. An NMR imaging method comprising the steps of:
  (a) placing an object within a predetermined static magnetic field, the object having nuclear spins with two kinds of chemical shifts;
  (b) obtaining nuclear spin data of the object in a time domain including the sub-steps of,
    (1) exciting nuclear spins in a predetermined slice of the object,
    (2) inverting the sense of the nuclear spins by a 180° RF pulse in order to generate a spin echo,
    (3) applying a first field gradient of selectable amplitude in a first direction to encode spatial information into the phase of the nuclear spins,
    (4) applying a second field gradient along a second direction perpendicular to the first direction to generate a peak in a resonance signal so that a time interval $\tau_1$ from the excitation of the nuclear spins to the inversion of the sense of the nuclear spins is made different by a time difference $\Delta\tau$ from a time interval $\tau_2$ from the inversion of the sense of the nuclear spins to the peak of the resonance signal so as to provide different nuclear spin phases for the two kinds of chemical shift,
    (5) reading out the resonance signal in the presence of the second field gradient, and
    (6) repeating a measurement sequence of the sub-steps (1)–(5) with the amplitude of the first field gradient being altered in the successive repetition;
  (c) transforming the nuclear spin data in the time domain into first nuclear spin data at respective coordinates in a spatial domain through two-dimensional Fourier transform; and
  (d) obtaining spin densities corresponding to the two kinds of chemical shift from the first nuclear spin data at the respective coordinates.

9. An NMR imaging method according to claim 8, wherein $\Delta\tau$ in the measurement sequence is set to provide a phase difference of an odd number times of $\pi/2$ between the two kinds of chemical shift.

10. An NMR imaging method according to claim 9, further comprising the steps of:
  obtaining second nuclear spin data of a reference sample having only one chemical shift and placed in the static magnetic field by repetition of a measurement sequence corresponding to the measurement sequence of sub-steps (1)–(5) and effecting a two-dimensional Fourier transform, the second nuclear spin data indicating phase errors at the respective coordinates in the spatial domain due to the error distribution of the static magnetic field;
  obtaining complex conjugates of the phases in the second nuclear spin data; and
  taking products of the first nuclear spin data and the complex conjugates to provide a distribution of the two kinds of chemical shift from their real parts and imaginary parts.

* * * * *